United States Patent
Pecen et al.

[11] Patent Number: 6,111,634
[45] Date of Patent: *Aug. 29, 2000

[54] METHOD AND APPARATUS FOR IN-SITU MONITORING OF THICKNESS USING A MULTI-WAVELENGTH SPECTROMETER DURING CHEMICAL-MECHANICAL POLISHING

[75] Inventors: Jiri Pecen, Palo Alto; John Fielden, San Jose, both of Calif.; Saket Chadda, Colorado Springs, Colo.; Lloyd J. LaComb, Jr., Tucson, Ariz.; Rahul Jairath, San Jose; Wilbur C. Krusell, Palo Alto, both of Calif.

[73] Assignee: Lam Research Corporation, Fremont, Calif.

[*] Notice: This patent issued on a continued prosecution application filed under 37 CFR 1.53(d), and is subject to the twenty year patent term provisions of 35 U.S.C. 154(a)(2).

[21] Appl. No.: 08/863,644

[22] Filed: May 28, 1997

[51] Int. Cl.[7] .................................................. G01B 11/06

[52] U.S. Cl. .......................... 356/72; 356/381; 250/559.27

[58] Field of Search ............................. 356/72, 381, 382; 250/559.27, 559.28

[56] References Cited

U.S. PATENT DOCUMENTS

| | | |
|---|---|---|
| 3,841,031 | 10/1974 | Walsh . |
| 4,193,226 | 3/1980 | Gill, Jr. et al. . |
| 4,308,586 | 12/1981 | Coates . |

(List continued on next page.)

FOREIGN PATENT DOCUMENTS

| | | |
|---|---|---|
| 0 481 935 A2 | 10/1991 | European Pat. Off. . |
| 0663265 | 7/1994 | European Pat. Off. . |
| 0 706 857 A1 | 10/1995 | European Pat. Off. . |
| 0 738 561 A1 | 10/1996 | European Pat. Off. . |
| 806266A2 | 11/1997 | European Pat. Off. . |
| 824995A1 | 2/1998 | European Pat. Off. . |
| 07052032 | 2/1995 | Japan . |
| 8-240413 | of 1996 | Japan . |
| 9-85611 | of 1997 | Japan . |
| WO 94/04599 | 3/1994 | WIPO . |
| WO 95/18353 WO | 7/1995 | WIPO .................................... 356/387 |
| 96/036459 | 11/1995 | WIPO . |
| WO98/114306 | 4/1998 | WIPO . |

OTHER PUBLICATIONS

Hariharan, P., "Optical Interferometry" Academic Press, Sydney, pp. V–XI, 1–9, 37–95 (1985).

Steel, W.H., "Interferometry," Cambridge University Press, Cambridge, pp. V–XI, 26–59, 232–251 (1983).

T. Cleary and C. Barnes, "Orbital Polishing Techniques for CMP," Proceedings of 1996 VMIC Conference, p. 443 (Jun. 1996).

Holger, Grahn, Maris & Tauc, "Picosecond Ultrasonics," IEEE Journal of Quantum Electronics, vol. 25, No. 12, pp. 2562–2569 (Dec. 1989).

Parikh et al., "Oxide CMP on High–Throughput Orbital Polisher," Feb. 13–14, 1997 CMP–MIC Conference.

(List continued on next page.)

*Primary Examiner*—F. L. Evans
*Attorney, Agent, or Firm*—Brinks Hofer Gilson & Lione

[57] ABSTRACT

A method and apparatus for in-situ monitoring of thickness using a multi-wavelength spectrometer during chemical mechanical polishing (CMP) of a substrate using a polishing tool and a film thickness monitor. The tool has an opening placed in it. The opening contains a monitoring window secured in it to create a monitoring channel. A film thickness monitor views the substrate through the monitoring channel to provide an indication of the thickness of a film carried by the substrate. This information can be used to determine the end point of the CMP process, determine removal rate at any given circumference of a substrate, determine average removal rate across a substrate surface, determine removal rate variation across a substrate surface, and optimize removal rate and uniformity. The film thickness monitor comprises a spectrometer.

21 Claims, 5 Drawing Sheets

6,111,634
Page 2

U.S. PATENT DOCUMENTS

| | | |
|---|---|---|
| 4,462,860 | 7/1984 | Szmanda . |
| 4,516,855 | 5/1985 | Korth . |
| 4,647,207 | 3/1987 | Björk et al. . |
| 4,653,924 | 3/1987 | Itonaga et al. . |
| 4,681,450 | 7/1987 | Azzam . |
| 4,710,030 | 12/1987 | Tauc et al. . |
| 4,776,695 | 10/1988 | van Pham et al. . |
| 4,793,895 | 12/1988 | Kaanta et al. . |
| 4,811,522 | 3/1989 | Gill, Jr. . |
| 4,844,617 | 7/1989 | Kelderman et al. . |
| 4,927,432 | 5/1990 | Budinger et al. . |
| 4,954,141 | 9/1990 | Takiyama et al. . |
| 4,957,368 | 9/1990 | Smith . |
| 5,020,283 | 6/1991 | Tuttle . |
| 5,036,015 | 7/1991 | Sandhu et al. . |
| 5,042,951 | 8/1991 | Gold et al. . |
| 5,061,072 | 10/1991 | Folkard et al. . |
| 5,067,805 | 11/1991 | Corle et al. . |
| 5,081,421 | 1/1992 | Miller et al. . |
| 5,081,796 | 1/1992 | Schultz . |
| 5,166,752 | 11/1992 | Spanier et al. . |
| 5,177,908 | 1/1993 | Tuttle . |
| 5,197,999 | 3/1993 | Thomas . |
| 5,213,655 | 5/1993 | Leach et al. . |
| 5,240,552 | 8/1993 | Yu et al. . |
| 5,297,364 | 3/1994 | Tuttle . |
| 5,298,110 | 3/1994 | Schoenborn et al. ................ 450/5 |
| 5,306,916 | 4/1994 | Norton et al. . |
| 5,308,438 | 5/1994 | Cote et al. . |
| 5,321,304 | 6/1994 | Rostoker . |
| 5,329,732 | 7/1994 | Karlsrud et al. . |
| 5,337,015 | 8/1994 | Lustiq et al. . |
| 5,413,941 | 5/1995 | Koos et al. . |
| 5,433,650 | 7/1995 | Winebarger . |
| 5,433,651 | 7/1995 | Lustig et al. . |
| 5,439,551 | 8/1995 | Meikle et al. . |
| 5,461,007 | 10/1995 | Kobayashi . |
| 5,486,129 | 1/1996 | Sandhu et al. ................ 451/5 |
| 5,486,701 | 1/1996 | Norton et al. . |
| 5,489,233 | 2/1996 | Cook et al. . |
| 5,517,312 | 5/1996 | Finarov . |
| 5,554,064 | 9/1996 | Breivogel et al. . |
| 5,558,568 | 9/1996 | Talieh et al. . |
| 5,595,526 | 1/1997 | Yau et al. . |
| 5,597,442 | 1/1997 | Chen et al. . |
| 5,605,760 | 2/1997 | Roberts . |
| 5,609,517 | 3/1997 | Lofaro . |
| 5,643,044 | 7/1997 | Lund . |
| 5,658,183 | 8/1997 | Sandhu et al. ................ 451/5 |
| 5,762,536 | 6/1998 | Pant et al. . |
| 5,816,891 | 10/1998 | Woo . |
| 5,838,447 | 11/1998 | Hiyama et al. . |

OTHER PUBLICATIONS

Fanton, et al., "Multiparameter Measurements of Thin Films Using Beam–Profile Reflectometry," Journal of Applied Physics, vol. 73, No. 11, pp. 7035–7040 Jun. 1, 1993.

Fanton, et al., "A Novel Technique for Performing Ellipsometric Measurements in a Sub–Micrometer Area." undated.

OPTI–PROBE™ Brochure, Therma–Wave, Inc., 1995.

European Search Report for EP 98 30 4242.

*European Search Report and Annex* with "Lack of Unity of Invention—Sheet B" for EP98304242.

European Search Report and Annex for EP98304212.

European Search Report for European Patent Application EP98304224.3; (3 Pages).

METHOD AND APPARATUS FOR IN-SITU MONITORING OF THICKNESS USING A MULTI-WAVELENGTH SPECTROMETER DURING CHEMICAL-MECHANICAL POLISHING

BACKGROUND OF THE INVENTION

The present invention relates to the field of semiconductor substrate processing and, more particularly, to the monitoring of material being removed during chemical-mechanical polishing of a semiconductor substrate.

The manufacture of an integrated circuit device requires the formation of various layers (both conductive, semiconductive, and non-conductive) above a base substrate to form necessary components and interconnects. During the manufacturing process, removal of a certain layer or portions of a layer must be achieved in order to planarize or in order to form the various components and interconnects. Chemical-mechanical polishing (CMP) is being extensively pursued to planarize a surface of a semiconductor substrate, such as a silicon substrate, at various stages of integrated circuit processing. It is also used in polishing optical surfaces, metrology samples, micro-machinery, and various metal and semiconductor based substrates.

CMP is a technique in which a polishing agent is used along with a polishing pad to polish away materials on a semiconductor substrate. The mechanical movement of the pad relative to the substrate, in combination with the chemical reaction of the polishing agent, provides an abrasive force with chemical erosion to planarize the exposed surface of the substrate (or a layer formed on the substrate).

In the most common method of performing CMP, a rotating wafer holder supports a wafer, and a polishing pad rotates relative to the wafer surface. The wafer holder presses the wafer surface against the polishing pad during the planarization process and rotates the wafer about a first axis relative to the polishing pad (see, for example, U.S. Pat. No. 5,329,732). The mechanical force for polishing is derived from the speed of the polishing pad rotating about a second axis different from the first and the downward force of the wafer holder. A polishing agent is constantly transferred under the wafer holder, and rotation of the wafer holder aids in polishing agent delivery and averages out local variations across the substrate surface. Since the polishing rate applied to the wafer surface is proportional to the relative velocity between the substrate and the polishing pad, the polish rate at a selected point on the wafer surface depends upon the distance of the selected point from the two primary axes of rotation—that of the wafer holder and that of the polish pad. This results in a non-uniform velocity profile across the surface of the substrate, and therefore, in a non-uniform polish. Additionally, it is generally accepted by those experienced in the art of CMP that a higher relative velocity between the wafer and the polish pad is desired for superior planarization performance (see, for example, Stell et al., in "Advanced Metallization for Devices and Circuits—Science, Technology and Manufacturability" ed. S. P. Murarka, A. Katz, K. N. Tu and K. Maex, pg 151). However, a higher average relative velocity in this configuration leads to a less desirable velocity profile across the surface of the substrate, and therefore, poor uniformity of polish.

This problem is solved by using a linear polisher. In a linear polisher, instead of a rotating pad, a belt moves a pad linearly across the substrate surface to provide a more uniform velocity profile across the surface of the substrate. The substrate is still rotated for averaging out local variations as with a rotating polisher. Unlike rotating polishers, however, linear polishers result in a uniform polishing rate across the substrate surface throughout the CMP process for uniformly polishing the substrate.

Additionally, linear polishers are capable of using flexible belts, upon which the pad is disposed. This flexibility allows the belt to flex, which can cause a change in the pad pressure being exerted on the substrate. A fluid bearing formed by a stationary platen can be utilized to control the pad pressure being exerted on a substrate at various locations along the substrate surface, thus controlling the profile of the polishing rate across the substrate surface.

Linear polishers are described in a patent application titled "Control of Chemical-Mechanical Polishing Rate Across A Substrate Surface;" Ser. No. 08/638,464; filed Apr. 26, 1996 and in a patent application titled "Linear Polisher and Method for Semiconductor Wafer Planarization;" Ser. No. 08/759,172; filed Dec. 3, 1996. Fluid bearings are described in a patent application titled "Control Of Chemical-Mechanical Polishing Rate Across A Substrate Surface For A Linear Polisher;" Ser. No. 08/638,462; filed Apr. 26, 1996 and in U.S. Pat. No. 5,558,568.

Rotating CMP systems have been designed to incorporate various in-situ monitoring techniques. For example, U.S. Pat. No. 5,081,421 describes an in-situ monitoring technique where the detection is accomplished by means of capacitively measuring the thickness of the dielectric layer on a conductive substrate. U.S. Pat. Nos. 5,240,552 and 5,439,551 describe techniques where acoustic waves from the substrate are used to determine end point. U.S. Pat. No. 5,597,442 describes a technique where the end point is detected by monitoring the temperature of the polishing pad with an infrared temperature measuring device. U.S. Pat. No. 5,595,526 describes a technique where a quantity approximately proportional to a share of the total energy consumed by the polisher is used to determine end point. U.S. Pat. Nos. 5,413,941, 5,433,651 and European Patent Application No. EP 0-738 561 A1 describe optical methods for determining end point.

In U.S. Pat. No. 5,413,941, a laser light impinges onto an area of the substrate at an angle greater than 70° from a line normal to the substrate, the impinged laser light predominantly reflecting off the area as opposed to transmitting through. The intensity of the reflected light is used as a measure of a change in degree of planarity of the substrate as a result of polishing. In U.S. Pat. No. 5,433,651, the rotating polishing table has a window embedded in it, which is flush with the table as opposed to the polishing pad. As the table rotates, the window passes over an in-situ monitor, which takes a reflectance measurement indicative of the end point of the polishing process. In European Pat. App. No. EP 0 738 561 A1, the rotating polishing table has a window embedded in it, which, unlike the one in the '651 patent, is flush with or formed from the polishing pad. A laser interferometer is used as the window passes over an in-situ monitor to determine the end point of the polishing process.

A linear polisher capable of in-situ monitoring for end point detection is described in U.S. patent application Ser. No. 08/869,655, assigned to the assignee of the present application.

Laser interferometry, however, has some inherent disadvantages. First, it measures absolute intensity of light emitting from an overlying substrate layer, and is dependent upon the material being polished. Second, in laser interferometry the operator cannot directly determine whether the film thickness being measured by the incident light is actually the desired finished thickness or some integer multiple thereof.

Additionally, an inherent limitation of these end point detection monitoring systems is that one has to analyze the interference curve and fit it to a reasonable approximation. Thus, depending upon the wavelength used and the film properties, there is a finite amount of removal (2000–4000 Å) before the interference curve can be fitted to a reasonable amount of accuracy. Further, using a single wavelength can, at best, only provide the removal rate, and based on the removal rate and prior knowledge of the initial thickness of the oxide, one can estimate the residual thickness of the oxide. Usually in a production fab, the initial thickness of the dielectric varies within the control limits of the deposition/ growth process. Therefore, the assumption of a particular initial thickness of oxide will create at least an error equivalent to the natural (6 sigma) scatter of the deposition process. Further, the need for removing at least 2000–4000 Å before a reasonable estimate of the removal rate can be made can be difficult to implement, especially in multi-cluster tools where the process demands that each cluster remove less than 2000 Å.

Ellipsometry, beam profile reflectometry, and optical stress generator beambased techniques can be used in in-situ monitors of a CMP process to provide a thickness measurement (see U.S. patent application Ser. No. 08/865,028. While these techniques overcome the problems discussed in the preceding paragraph, there are additional problems associated with them. For example, ellipsometry is a slow technique that is difficult to implement on some CMP tools such as a linear belt. Beam profile reflectometry requires a tightly focused beam and bulky optics—characteristics which pose potential problems for use in CMP. Optical stress generator beam-based techniques are cumbersome and difficult to implement in a CMP environment.

There is, accordingly, a need to provide thickness measurement in situ with CMP processes using either (i) platen-based systems such as those that rotate about their own axis, rotate in an orbital manner, or oscillate in a linear or circular manner, (ii) belt-based systems such as those that use endless or non-endless belts, or (iii) oscillating carrier head systems to overcome the disadvantages found in the prior art.

SUMMARY OF THE INVENTION

This invention relates to chemical-mechanical polishing (CMP) of a substrate using a polishing tool and a film thickness monitor for providing a thickness of a substrate layer.

According to a first aspect of the invention, a polishing element has an opening placed in it. A monitoring window is secured to the polishing element to close the opening and to create a monitoring channel. A film thickness monitor views the substrate through the monitoring channel to provide an indication of the thickness of a film carried by the substrate. The film thickness monitor comprises a spectrometer.

According to a second aspect of the invention, the film thickness monitor comprises a light source; a light sensitive detector (such as a spectrometer) for monitoring an intensity from the light source; a spectrometer that dispenses light into multiple wavelengths that are detected by multiple detectors; and a data processing element for processing the signal from the spectrometer and estimating the thickness of any film on the substrate. The light source can be a flash lamp emitting optical radiation synchronous with a moving substrate or polishing element or a substantially continuously operating light source having a shutter operating synchronously with a moving substrate or polishing element in order to output light at a correct time.

According to a third aspect of the invention, the moving means comprises a plurality of rollers operative to drive the polishing element in a linear path past the substrate, a platen rotating about an axis that passes through its center operative to drive the polishing element in a curved path past the substrate, a platen rotating about an axis that does not pass through its center operative to drive the polishing element in a curved path past the substrate, or a platen moving along a closed path operative to drive the polishing element in a curved path past the substrate.

According to a fourth aspect of the invention, the substrate carrier moves along a closed path.

According to a fifth aspect of the invention, a polishing element is used in a method for determining the thickness of a substrate layer by using a multi-wavelength spectrometer.

According to a sixth aspect of the invention, a polishing element is used in a method for determining an end point of the CMP process by repeatedly measuring film thickness of a substrate to determine whether a predefined thickness has been reached, in which case the fact that end point has been reached can be indicated and the CMP process can be terminated.

According to a seventh aspect of the invention, a polishing element is used in a method for determining removal rate at any given circumference of a substrate while performing CMP by determining the difference between two consecutive film thickness measurements made through the same monitoring channel in the polishing element.

According to an eighth aspect of the invention, a polishing element is used in a method for determining average removal rate across a substrate surface while performing CMP by determining the average of the differences between at least two consecutive film thickness measurements taken by at least two film thickness monitoring devices.

According to a ninth aspect of the invention, a polishing element is used in a method for determining removal rate variation across a substrate surface while performing CMP by determining the variation of the differences between at least two consecutive film thickness measurements taken by at least two film thickness monitoring devices.

According to a tenth aspect of the invention, a polishing element is used in a method for optimizing the CMP process by characterizing a polishing process to determine effects of processing parameters; and then determining removal rate and removal rate variation; and then adjusting the polishing process parameters to optimize the removal rate and uniformity.

DETAILED DESCRIPTION OF THE PRESENTLY PREFERRED EMBODIMENTS

FIRST PREFERRED EMBODIMENT

Figure 1:
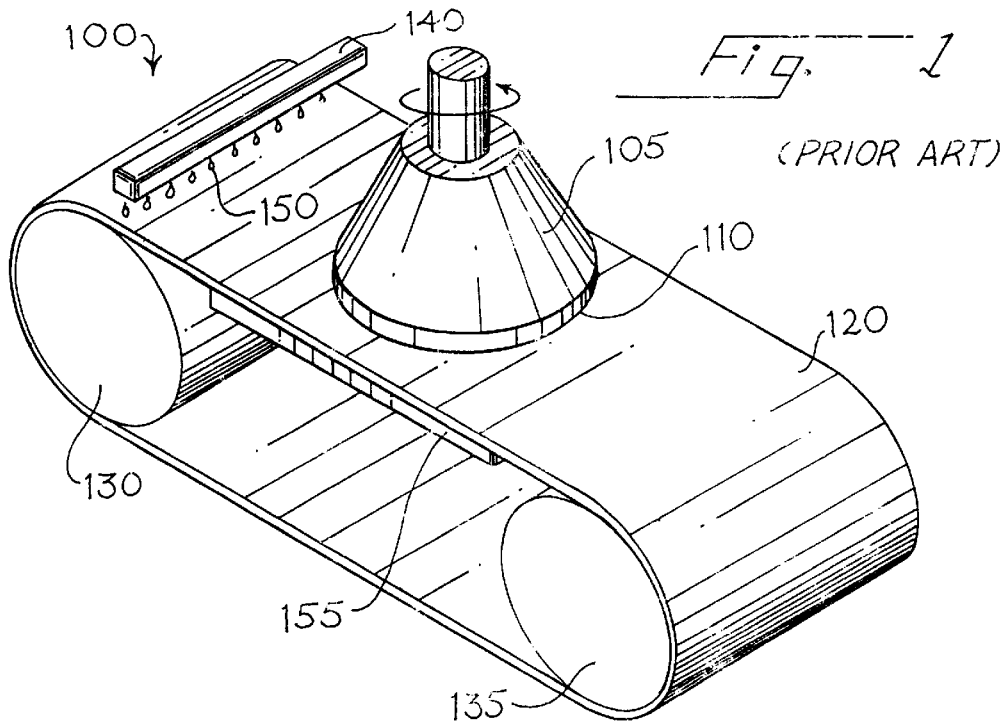
FIG. 1 is a schematic view of a prior-art linear polisher.

Turning now to the drawings, FIG. 1 illustrates a prior art linear polisher 100 utilized in planarizing a substrate (not shown) through a technique generally known in the art as chemical-mechanical polishing (CMP). As shown in this figure, the linear polisher 100 has a substrate carrier 110 attached to a polishing head 105 that secures the substrate. The substrate is positioned on a belt 120, which moves about first and second rollers 130 and 135. As used herein, "belt" refers to a closed-loop element comprising at least one layer, at least one layer is a layer of polishing material. A discussion of the layer(s) of the belt element is developed below.

A polishing agent dispensing mechanism 140 provides a polishing agent 150 on top of the belt 120. The polishing agent 150 moves under the substrate along with the belt 120 and may be in partial or complete contact with the substrate at any instant in time during the polish process. A platen 155 supports the belt 120 under the substrate carrier 110.

Generally, the substrate carrier 110 rotates the substrate over the belt 120. A mechanical retaining means, such as a retainer ring and/or a vacuum typically holds the substrate in place.

The belt 120 is continuous and rotates about the rollers 130, 135. Driving means, such as a motor (not shown), rotate the rollers 130, 135, causing the belt 120 to move in a linear motion with respect to the surface of the substrate.

As the belt 120 moves in a linear direction, the polishing agent dispensing mechanism 140 provides polishing agent 150 to the belt 120. A conditioner (not shown) is typically used to recondition the belt 120 during use by constantly scratching the belt 120 to remove polishing agent residue build-up and/or pad deformation.

The belt 120 moves between the platen 155 and the substrate, as shown in FIG. 1. A primary purpose of platen 155 is to provide a supporting platform on the underside of the belt 120 to ensure that the belt 120 makes sufficient contact with the substrate for uniform polishing. Typically, the substrate carrier 110 presses downward against the belt 120 with appropriate force, so that the belt 120 makes sufficient contact with the substrate for performing CMP. Since the belt 120 is flexible and will depress when the substrate presses downward onto it, the platen 155 provides a necessary counteracting support to this downward force.

The platen 155 can be a solid platform or it can be a fluid bearing (which includes one or more fluid channels). A fluid bearing is preferred because the fluid flow from the platen 155 can be used to control forces exerted against the underside of the belt 120. By such fluid flow control, pressure variations exerted by the belt 120 on the substrate can be controlled to provide a more uniform polishing rate of the substrate. Examples of fluid bearings are disclosed in the aforementioned patent applications and in U.S. Pat. No. 5,558,568, each incorporated by reference.

Figure 2:
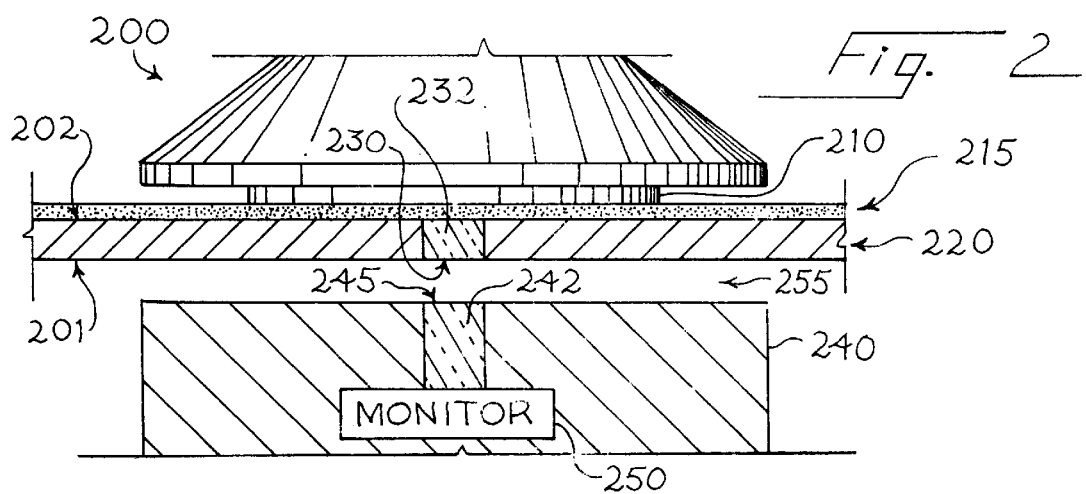
FIG. 2 is a cross-sectional view of a linear polisher of a first preferred embodiment.

FIG. 2 shows a cross section of a first preferred embodiment of the present invention, which represents an improvement to the prior-art linear polisher 100 described above. As in the prior-art embodiment, the linear polisher 200 of FIG. 2 comprises a substrate carrier 210, a layer of polishing agent 215, a belt 220, and a platen 240 for performing CMP on a substrate (not shown). The belt 220 has a layer of polishing material (not shown), an inner surface 201, and an outer surface 202. (The composition of the belt 220 is described in more detail below.) New to this embodiment is an opening 230 in the belt 220 (extending from its inner surface 201 to its outer surface 202) and an opening 245 in the platen 240. Additionally, a layer of liquid mist such as that of de-ionized water 255 lies between the belt 220 and the platen 240.

This embodiment performs CMN in the same way as the prior-art linear polisher 100 described above. Unlike the above-described polisher 100, this polisher 200 can be used with an in-situ film thickness monitor 250. Specifically, the openings 230, 245 in the belt 220 and the platen 240 are used for in-situ monitoring of the substrate by the monitor 250. As the belt 220 moves linearly under the substrate during the CMN process, the opening 230 in the belt 220 passes over the opening 245 in the platen 240. When the openings 230, 245 align (as shown in FIG. 2), an optical circuit is completed between the substrate and the film thickness monitor 250, and in-situ monitoring can be performed. The monitoring process will be discussed in greater detail below.

While they can be left open, the openings 230, 245 in the belt 220 and the platen 240 have monitoring windows 232, 242 embedded in them. The monitoring window 232 in the belt 220 is substantially transparent to light within a selected range of optical wavelengths and extends completely or partially between the inner 201 and outer 202 surfaces of the belt 220. Generally, the monitoring window 232 in the belt 220 ensures that no polishing agent 215 or water leaks to the underside of the belt 220. By being flush with the outer surface 202 of the belt 220, implications with the polishing process are avoided. By being flush with the inner surface 201 of the belt 220, the creation of turbulent regimes in the fluid bearing of the platen 240 is avoided (though, it could be just a little raised or recessed).

Unlike the windows in the prior art, rotating platen systems, the monitoring window 232 should also be flexible enough to ride over the rollers (which can range from 2 to 40 inches in diameter) moving the belt 220 and should be made of a material that will have a minimum effect on the polishing results due to its presence. Depending on the monitoring system used, the monitoring window 232 may also need a particular optical characteristic (e.g., maximum transmission of radiation from about 200 nm up to about 2000 nm in wavelength with minimum absorption or scattering).

The monitoring window 242 filling the opening 245 in the platen 240 is preferably flush with the top surface of the platen 240 to prevent polishing agent from flowing into the film thickness monitor 250 and to avoid creation of turbulent regions in the fluid bearing of the platen 240. As with the monitoring window 232 in the belt 220, the monitoring window 242 in the platen 240 preferably provides desired optical characteristics (e.g., maximum transmission of the spectrum of light being generated from the monitor 250 and reflected from the surface of the substrate).

SECOND PREFERRED EMBODIMENT

Figure 3:
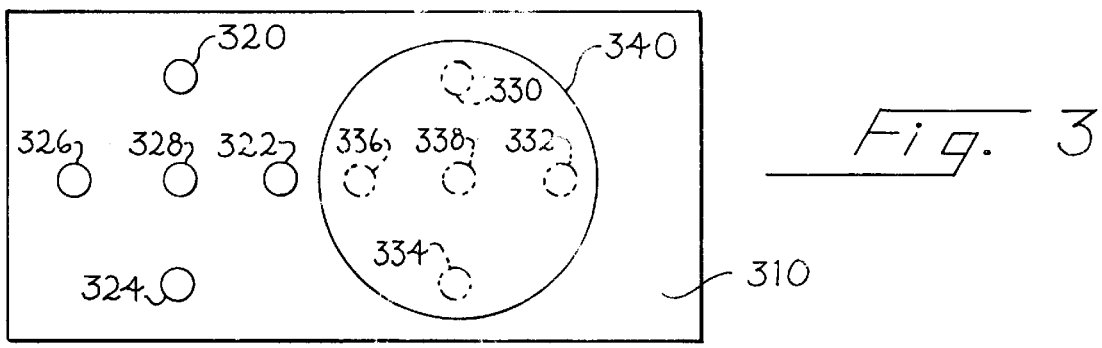
FIG. 3 is a plan view showing a placement of openings in a platen and a pattern of openings on a belt to align with the openings in the platen.

While the belt 220 of the above embodiment contains only one opening, a plurality of openings can be used. As shown in FIG. 3, the belt 310 can contain a plurality of openings 320, 322, 324, 326, 328. For each opening 320, 322, 324, 326, 328 in the belt 310, there is a corresponding opening 330, 332, 334, 336, 338 in the platen under the substrate carrier 340. Each opening 330, 332, 334, 336, 338 is aligned with a respective film thickness monitor. As above, each opening can be closed by a monitoring window.

In this figure, there are five openings, one at the center of the substrate and four arranged at 90 degree intervals. It is appreciated that the number or the pattern of the openings is a design choice. For example, the openings can be linearly or concentrically arranged. With several film thickness monitors distributed under respective locations of the belt 310, non-uniformity of the polishing process across the substrate surface can be ascertained.

Figure 10:
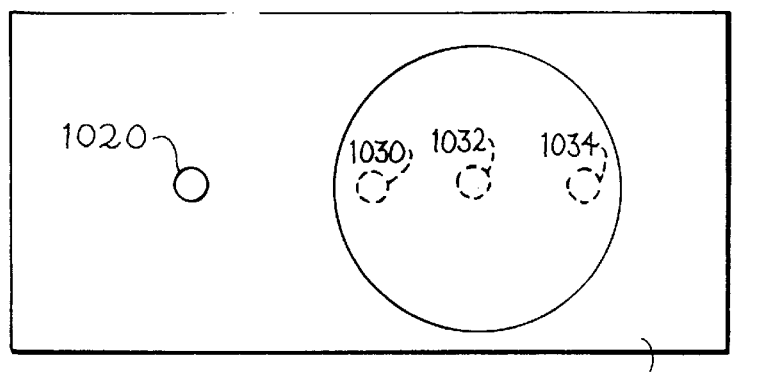
FIG. 10 is a plan view showing a placement of a plurality of openings in a platen and a belt having only one opening.

Alternatively, as FIG. 10 shows, a single opening 1020 in the belt 1010 can be used with multiple openings 1030, 1032, 1034 in the platen, each opening corresponding to a respective film thickness monitor. As above, each opening can be closed by a monitoring window. The openings 1030, 1032, 1034 in the platen are aligned in a straight line parallel to belt 1010 motion. When the belt opening 1020 is aligned with one of the openings 1030, 1032, 1034 in the platen, the film thickness monitor corresponding to that platen opening can make a measurement of the surface condition of the polished object. With this arrangement, the condition of multiple areas of the surface can be monitored with a single opening in the belt 1010. It is important to note that the number and position of platen openings, as well as the number of straight lines parallel to the belt 1010, is a design choice.

THIRD PREFERRED EMBODIMENT

Figure 4:
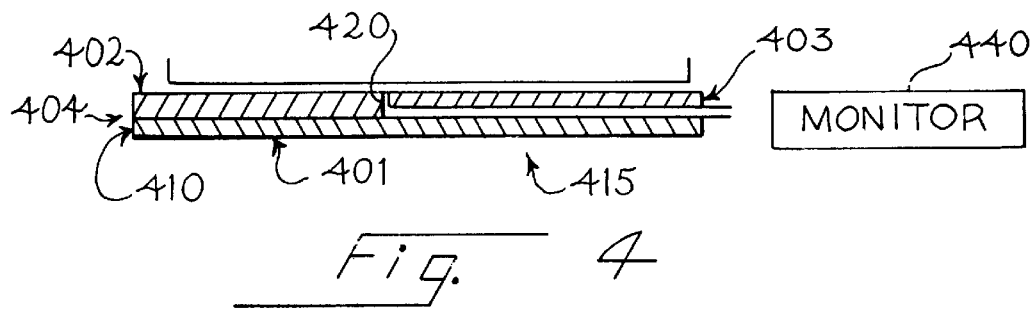
FIG. 4 is a cross-sectional view of a fiber-optic transmission line disposed between two layers of a belt to provide for an extended optical signal path from an outer surface of the belt to a first side surface of the belt.

FIG. 4 shows another alternative embodiment. Here, there is no opening in the platen for a monitoring channel. Instead, an opening 420 is formed in the belt 415 for an extended monitoring channel. This figure shows a belt 415 having two layers (one of which is layer 410), an inner surface 401, an outer surface 402, a first side surface 403, and a second side surface 404. The monitoring channel 420 is such that the optical path travels laterally parallel to the upper surface of one layer 410 of the belt 415 from the outer surface 402 to the first side surface 403. A film thickness monitor 440 is positioned adjacent to the first side surface 403 of the belt 415, instead of under the belt 415.

In this embodiment, a monitoring window fills the opening 420 to complete the optical circuit from the substrate to the film thickness monitor 440. This monitoring window can be a flexible fiber optic element.

Figure 5:
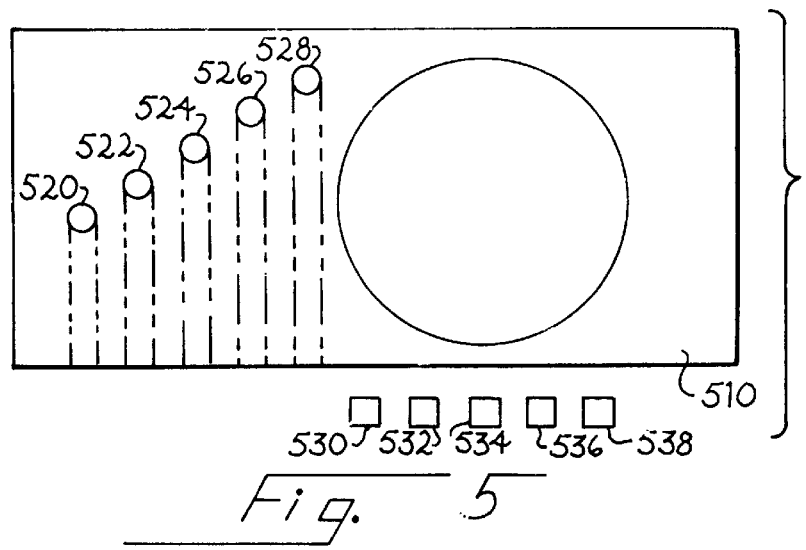
FIG. 5 is a plan view showing a placement of sensing locations in a belt, but not in a platen, in which a fiber optic arrangement of FIG. 4 is employed with multiple film thickness monitors.

As with the embodiments described above, this approach can be implemented with more than one monitoring channel. FIG. 5 shows a plan view of an embodiment having a plurality of monitoring channels 520, 522, 524, 526, 528. Here, a linearly aligned, slanted hole pattern is shown formed on the belt 510. The distal end of the fiber-optic transmission lines are terminated adjacent to a row of film thickness monitors 530, 532, 534, 536, 538 arranged along the side of the linearly moving belt 510. In this arrangement, the positions of the film thickness monitors can be adjusted to align with the optic fibers, since the film thickness monitors can be made movable. Thus, this embodiment allows for less stringent requirement in the placement of the monitoring channels, since adjustments can be made in the positions of the film thickness monitors 530, 532, 534, 536, 538.

Figure 6:
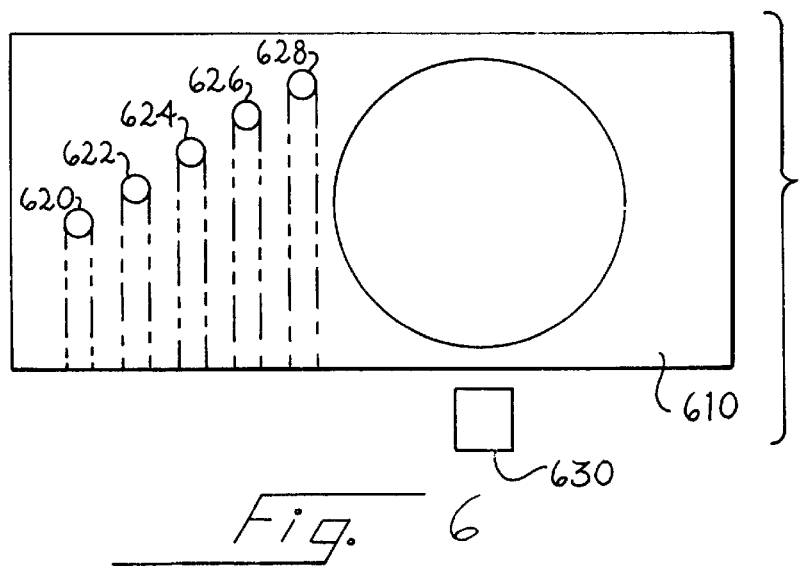
FIG. 6 is a plan view showing a placement of sensing locations in a belt, but not in a platen in which a fiber optic arrangement of FIG. 4 is employed with only one film thickness monitor.

While a plurality of film thickness monitors are shown in FIG. 5, a single film thickness monitor 630 can be used, as FIG. 6 illustrates. This single film thickness monitor 630 is positioned along side the moving belt 610 and takes the place of multiple film thickness monitors. In this embodiment, the optical-fiber-filled monitoring channels 620, 622, 624, 626, 628 can be made to traverse across the film thickness monitor 630 in a linear arrangement. Although detection cannot be performed simultaneously in multiple monitoring channels, as when multiple film thickness monitors are utilized, data can still be obtained for each monitoring channel.

It is important to note that in the above alternatives, the monitoring channel can either extend from the outer to the first side surface (in which case the monitor can be positioned along the side of the belt) or extend from the outer surface to the inner surface of the belt (in which case the monitor can be at least partially disposed within the belt). It is also important to note that the pattern of openings on the belt may be repeated more than once in order to obtain multiple measurements per belt rotation. This provides more data points per unit time, thereby improving the quality of the results obtained.

BEST MODE AND BELT CONSTRUCTION

Using a fluid bearing (preferably air) is more advantageous than using a solid platen, since monitoring data can be used to adjust the fluid pressure at varying locations of the platen to provide in-situ correction during the polishing process. It is preferred that the platen have about 1–30 fluid flow channels. It is also preferred that a pre-wet layer of de-ionized water mist be used between the platen and the belt to sweep away any polishing agent that happens to come underneath the belt, preventing blockage of the flow channels.

The monitoring window in the platen is preferably made from a hard, scratch-resistant material such as sapphire. A sapphire window from the Swiss Jewel Company (Part No. W12.55) is preferred. The monitoring window in the platen is secured in place with an adhesive sufficiently strong to withstand the conditions of the CMP process. It is preferred that the monitoring window have an anti-reflection coating on one or more surfaces.

In using the above embodiments, it is preferred that a carrier film such as that available from Rodel (DF200) be used between the substrate and the substrate carrier. The substrate carrier preferably presses the substrate against the belt with a pressure of about 5 psi.

The polishing agent has a pH of about 1.5 to about 12. One type of polishing agent that can be used is Klebesol available from Hoechst, although other types of polishing agent can be used depending on the application.

During the CMP process, the rollers preferably rotate at a rate so as to provide a belt speed of about 400 ft/min. The belt should be tensioned with a force of about 600 lbs.

As mentioned above, a "belt" comprises at least one layer of material, one of which is a layer of polishing material. There are several ways in which to construct a belt. One way uses a stainless steel belt, which can be purchased from Belt Technologies, having a width of about 14 inches and a length of about 93.7 inches, inner diameter. (In addition to stainless steel, a base layer selected from the group consisting of aramid, cotton, metal, metal alloys, or polymers can be used.) The preferred construction of this multi-layered belt is as follows.

The stainless steel belt is placed on the set of rollers of the CMP machine and is put under about 2,000 lbs of tension. When the stainless steel belt is under tension, a layer of polishing material, preferably Rodel's IC 1000 polishing pad, is placed on the tensioned stainless steel belt. An underpad, preferably made of PVC, is attached to the underside of the stainless steel belt with an adhesive capable of withstanding the conditions of the CMP process. The constructed belt preferably will have a total thickness of about 90 mils: about 50 mils of which is the layer of polishing material, about 20 mils of which is the stainless steel belt, and about 20 mils of which is the PVC underpad.

There are several disadvantages of the above construction method. First, because the stainless steel belt needs to be tensioned on the rollers, there is down time for the CMP machine. Second, this construction requires technicians and time to place the pad on the stainless steel belt.

To overcome these disadvantages, the belt can be formed as one integrated component as described in a patent application titled "Integrated Pad and Belt for Chemical Mechanical Polishing;" Serial No. Ser. No. 08/800,373, filed Feb. 14, 1997, hereby incorporated by reference. The preferred construction of such an assembly follows.

This belt is formed around a woven Kevlar fabric. It has been found that a 16/3 Kevlar, 1500 Denier fill and a 16/2 cotton, 650 Denier warp provide the best weave characteristics. As is well known in the art, "fill" is yarn in the tension-bearing direction, and "warp" is yarn in the direction perpendicular to the tension bearing direction. "Denier" defines the density and diameter of the mono-filament. The first number represents the number of twists per inch, and the second number refers to the number of filaments that are twisted in an inch.

The woven fabric is placed in a mold that preferably has the same dimensions as the stainless steel belt described above. A clear polyurethane resin (as described in more detail below) is poured into the mold under a vacuum, and the assembly is then baked, de-molded, cured, and ground to the desired dimension. The resin may be mixed with fillers or abrasives in order to achieve desired material properties and/or polishing characteristics. Since fillers and abrasive particles in the polishing layer may scratch the polished article, it is desired that their average particle size be less than about 100 microns. Such a belt can be obtained pre-constructed from Belting Industries.

Instead of molding and baking the woven fabric with polyurethane, a layer of polishing material, preferably a Rodel IC 1000 polishing pad, can be attached to the woven fabric or the preconstructed belt as it was on the stainless steel belt.

In any of these belt constructions, fillers and/or abrasive particles (having an average particle size less than 100 microns) can be dispersed throughout the polishing layer to enable use of lower concentration of abrasive particles in the polishing agent. The reduction of abrasive particle concentration in the polishing agent leads to substantial cost savings (typically, polishing agent costs represent 30–40% of the total cost of CMP processes). It also leads to a reduction in light scattering due to the presence of polishing agent particles. This reduces noise in the signal obtained by the monitor and helps in getting more accurate and repeatable results.

The polishing layer may also comprise a polishing agent transport channel. The polishing agent transport channel is a texture or pattern in the form of grooves (depressions) etched or molded into the surface of the polishing layer. These grooves may be, for example, of rectangular, U-, or V-shape. Typically, these channels are less than 40 mils deep, and less than 1 mm wide at the polishing layer's upper surface. The polishing agent transport channels are typically arranged in a pattern such that they run the length of the polishing surface. However, they may be arranged in any other pattern as well. The presence of these channels greatly enhances the transport of polishing agent between the polishing layer and polish substrate. This leads to improved polishing rates and uniformity across the substrate surface.

With any of the belts described above, a hole may be punched in the belt at the desired location to form the opening. The opening in the belt is preferably ½ inch in width (across the belt) by 3½ inches in length (along the belt).

The monitoring window filling the opening in the belt can be made up of a variety of materials such as clear polyurethane (solid, filled, blown or extruded), PVC, clear silicone, or many other plastics. It is preferred, however, that clear polyurethane be used, as this material has maximum transmission of radiation from about 200 nm up to about 2000 nm in wavelength with minimum absorption or scattering. A suitable clear urethane resin can be purchased as "Calthane ND 2300 System" and "Calthane ND 3200 System" from Cal Polymers, Inc., 2115 Gaylord St., Long Beach, Calif. The layer of polishing material can be made from a similar material to ensure minimum effect on the polishing results.

The monitoring window can be secured in the opening with an adhesive sufficiently strong to hold the monitoring window in place during the CMP process. The adhesive is preferably 2141 Rubber and Gasket adhesive available from 3M, Minneapolis, Minn.

Alternatively, the monitoring window can be molded directly in the belt. For the belt with a stainless steel layer, the polyurethane resin can be cast in the opening. A casting with a mirror-finished rubber lining can be placed on both sides of the opening during the curing process. For the belt with the woven fabric layer, openings can be made in the woven fabric before placing it in the mold. After the baking process described above, the opening in the belt would contain the polyurethane monitoring window.

As an alternative to placing openings in the belt, each layer of the belt can be partially or completely made of a material substantially transparent to light within a selected range of optical wavelengths, such as about 200 nm to about 2000 nm, eliminating the need to provide a monitoring window in the belt. For example, the fabric may be woven with Kevlar or some other material so as to provide openings in the fabric, or may be constructed with optically clear fiber. Clear polyurethane (or some other clear material) is then molded onto the fabric in a manner described above. This results in a belt assembly that is appropriate for film thickness measurements.

FOURTH PREFERRED EMBODIMENT

Figure 9:
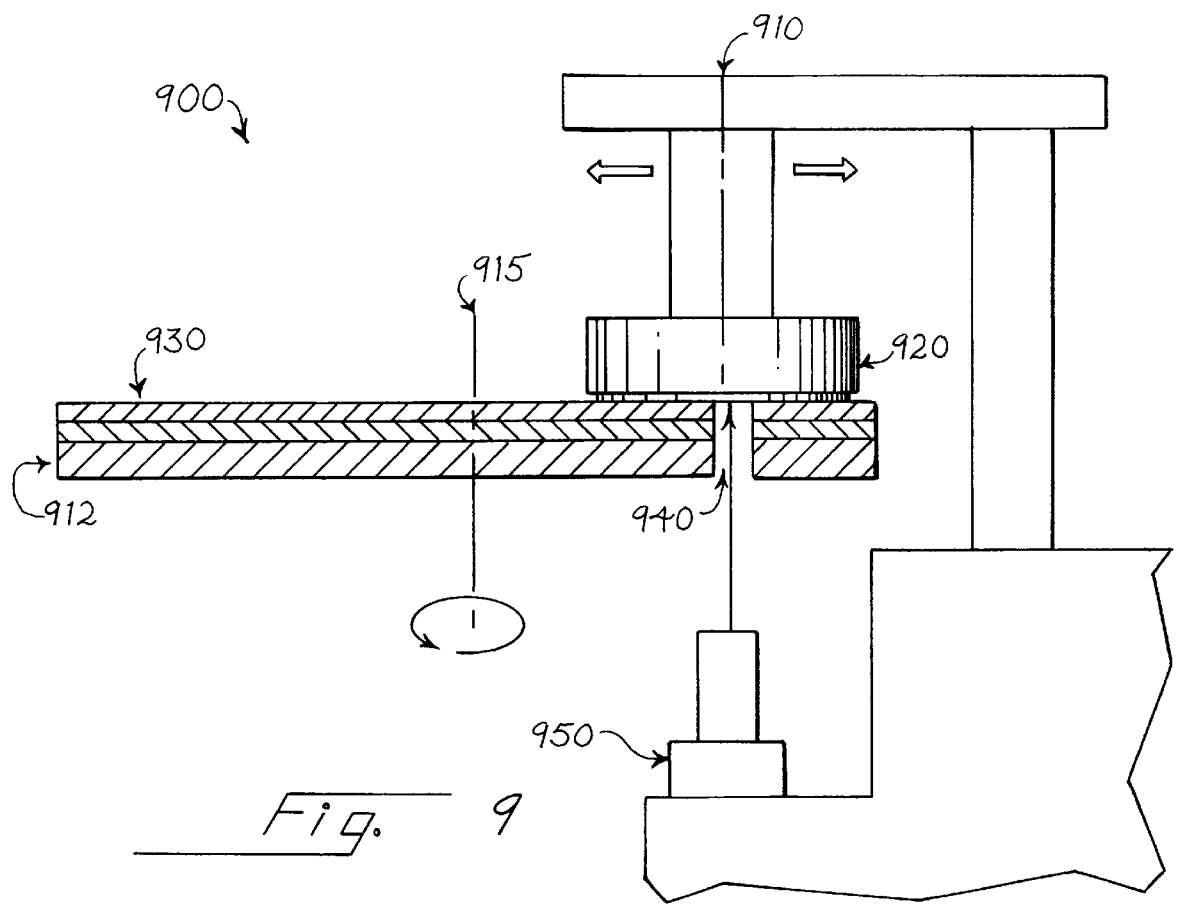
FIG. 9 is a schematic diagram of a rotating platen CMP device with a film thickness monitor.

FIG. 9 illustrates a fourth preferred embodiment. In this embodiment, a rotating polishing device 900 is used for CMP instead of a linear belt. Such an apparatus is well known in the art (U.S. Pat. Nos. 5,329,732; 5,081,796; 5,433,651; 4,193,226; 4,811,522; and 3,841,031, hereby incorporated by reference).

As shown in FIG. 9, a rotating wafer holder 920 supports a wafer, and a polishing element (a polishing pad 930 on a platen 912) rotates relative to the wafer surface. The wafer holder 920 presses the wafer surface against the polishing pad 930 during the planarization process and rotates the wafer about a first axis 910 relative to the polishing pad 930 (see, for example, U.S. Pat. No. 5,329,732). The polishing pad 930 is typically a relatively soft wetted material such as blown polyurethane and it, with the platen 912, rotates around an axis 915 (unlike the stationary platen used with the linear belt).

The mechanical force for polishing is derived from the speed of the polishing pad 930 rotating about a second axis 915 different from the first 910 and the downward force of the wafer holder 920. A polishing agent (per the specifics described above for the linear polishing tool) is constantly transferred under the wafer holder 920, and rotation of the wafer holder 920 aids in polishing agent delivery.

Since the polishing rate applied to the wafer surface is proportional to the relative velocity between the substrate and the polishing pad 930, the polish rate at a selected point on the wafer surface depends upon the distance of the selected point from the two primary axes of rotation—that of the wafer holder 920 and that of the polish pad 930. This results in a non-uniform velocity profile across the surface of the substrate, and therefore, in a non-uniform polish.

In situ monitoring can take place with such an apparatus by providing an opening 940 in the rotating platen 912, in the polishing pad 930, or both. A monitoring window secures to the polishing element to close the opening in at least the platen 912, creating a monitoring channel in the polishing element. A film thickness monitor 950 is disposed under the opening 940 at certain times during the angular rotation of the platen 912 and polishing pad 930. (The use of the monitor 950 is described in more detail below.) It is important to note that multiple openings, monitoring windows, and film thickness monitors can be used.

In addition to a platen rotating about an axis that passes through its center, a platen rotating about an axis that does not pass through its center can be used to drive the polishing element in a curved path past the substrate. Additionally, the platen can move along a closed path to drive the polishing element in a curved path past the substrate. (See T. Cleary and C. Barnes, "Orbital Polishing Techniques for CMP," Proceedings of 1996 VMIC Conference, p. 443, June 1996 and WO 96/36459.) Also, in any of the CMP systems described above, the substrate carrier can move along a closed path.

FILM THICKNESS MONITOR

Figure 7:
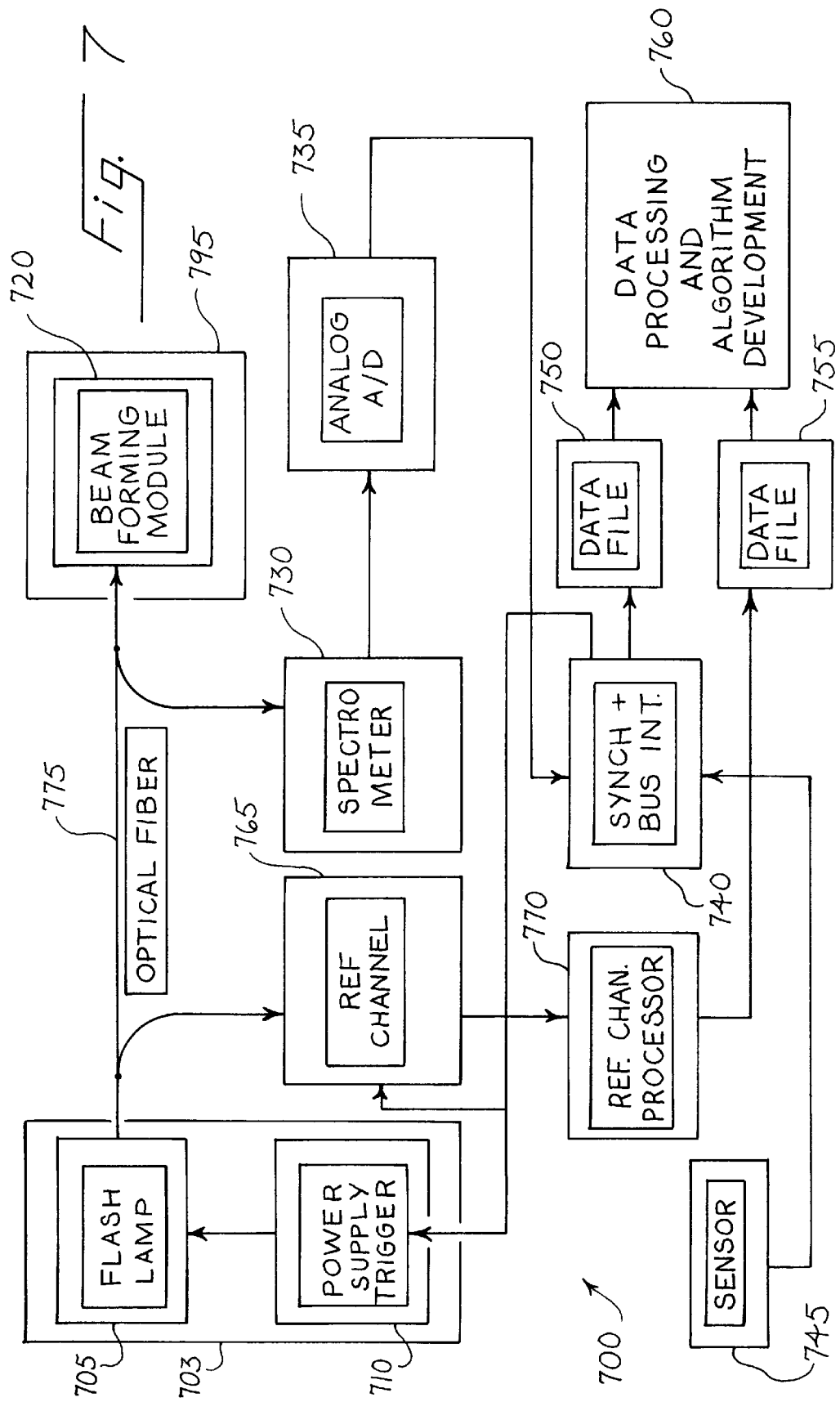
FIG. 7 is a block diagram of a monitoring system using multiple wavelength illumination with a spectrometer.
Figure 8:
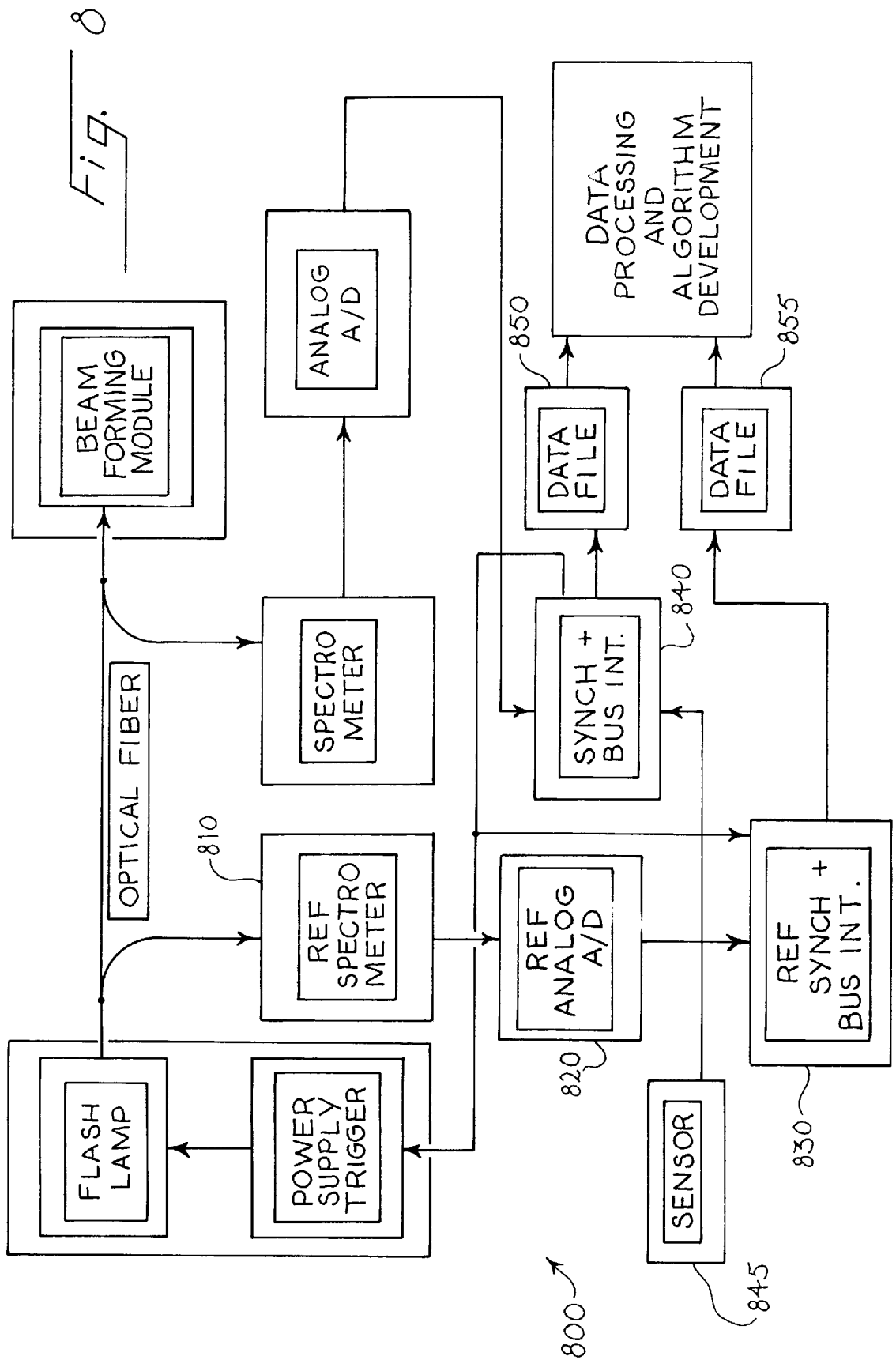
FIG. 8 is a block diagram of an alternative monitoring system, in which a reference spectrometer replaces a reference channel.

The film thickness monitor, mentioned above, can be used to calculate the thickness of a layer on a substrate. Any suitable film thickness monitor that provides thickness can be used with the preferred embodiments described above. For example, thickness can be measured with ellipsometry, beam profile reflectometry, or optical stress generator beam-based techniques (as described in U.S. patent application Ser. No. 08/865,028, assigned to the assignee of the present application, hereby incorporated by reference). However, the technique described below is preferred.
Multi-Wavelength Spectroscopy FIG. 7 shows the components of a system 700 using multiple wavelength illumination, the preferred monitoring system. The system 700 comprises an illumination module 703 comprising a flash lamp 705 and a power supply with trigger 710. The system 700 also comprises a spectrometer 730, an analog-to-digital converter 735, a synchronizer and bus interface 740, a first and second data file 750, 755, a reference channel 765, a reference channel processor 770, a window sensor 745, and a data processing and algorithm development block 760. An optical fiber 775 optically connects the flash lamp 705, the reference channel 765, and the spectrometer 730 to a beam forming module 720 in a platen 795. This system 700 is used to calculate the thickness of a film on a wafer positioned over the platen 795, as described below.

The flash lamp 705 generates light in the range of about 200 nm to 2 microns. The optical fiber 775 carries a portion of the light from the flash lamp 705 to the reference channel 765. The reference channel 765 measures the total energy of the light and generates an analog signal representing the total energy to the reference channel processor 770. The reference channel processor 770 converts the analog signal to a digital signal and transmits the digital signal to the second data file 755. The use of the information stored in the second data file 755 will be described in more detail below.

The optical fiber 775 also carries another portion of the light from the flash lamp 705 to the beam forming module 720 inside the platen 795. The beam forming module 720 changes the diameter of the light to focus or collimate a beam of a particular spot size on a wafer (not shown). The beam forming module includes a single or multiple lens or microscope objective and an aperture window. The lens defines the illumination spot size and focuses reflected light back on the optical fiber. The aperture window defines which portion of the reflected light is collected.

When the light beam illuminates the wafer, the wafer reflects part of the light beam. The spectrometer 730 measures the spectrum of the reflected light and generates an analog signal representing the spectrum of the reflectance. The analog-to-digital converter 735 converts the analog signal to a digital signal and sends the digital signal to the synchronizer and bus interface 740.

The synchronizer and bus interface 740 is responsive to the sensor 745. The sensor 745 detects when a window in the belt is aligned with a window in the platen, and the sensor 745 enables the interface 740 when it is appropriate to generate the light beam and detect the spectrum of the reflected beam from the wafer.

Upon receiving the signal from the sensor, the synchronizer and bus interface 740 coordinates three functions. First, it sends a trigger to the power supply 710, causing the flash lamp 705 to generate a light pulse to illuminate the wafer. Second, the synchronizer and bus interface 740 causes the reference channel 765 to measure the total energy of the portion of the light pulse directed to the reference channel 765. This measurement is recorded in the second data file 755. Third, the synchronizer and bus interface 740 records the digital signal from the analog-to-digital converter 735 in the first data file 750. This coordination ensures that the first data file 750 records only data that is collected when the wafer is illuminated.

The information stored in the first and second data files 750, 755 is used in a data processing and algorithm development block 760. The block 760 uses the information stored in the second data file 755 to normalize the information of the second data file 755 for variations in pulse intensity caused by, for example, aging of the flash lamp 705. The block 760 then uses this normalized information and the information stored in the first data file 750 to calculate the thickness of the film of the wafer at the measurement point. Computer analysis of the detected spectral reflection function, especially its minima and maxima, provides the thickness, and in some cases, also the index of refraction of the measured film.

Further information about spectrometry may be found in Bell, R. J. "Introductory Fourier Transform Spectroscopy" Academic Press, New York (1972) and Hutley, M. C., "Diffraction Gratings" Academic Press, London (1982). Spectrometry is also described in U.S. Pat. Nos. 5,517,312; 5,486,701; 4,308,586; and 4,844,617.

Alternatives

In place of flash lamp 705, a substantially continuously operating light source can be used with a shutter or chopper wheel operating synchronously with a moving substrate in order to output light when the substrate is positioned over the light source.

In a system 800 of another alternative embodiment, a reference spectrometer 810, a reference analog-to-digital converter 820, and a reference synchronizer and bus interface 830 replace the reference channel 765 and the reference channel processor 770 in system 700 of FIG. 7. The other components of system 800 are similar to those of system 700.

Instead of measuring merely the total energy as the reference channel does in system 700, the reference spectrometer 810 measures the spectrum of the light pulse that illuminates the wafer. The reference analog-to-digital converter 820 translates the analog signal carrying the spectrum information to a digital signal, which is sent to the reference synchronizer and bus interface 830. The reference synchronizer and bus interface 830 records the spectrum information in the second data file 855 in response to a signal from the sensor 845.

When the light beam exits the beam forming module, it is subject to distortion from, for example, the media it passes through before encountering the wafer. When the distortion of the beam is much larger than the fluctuation in the light source, the coarse measurement that the reference channel provides is sufficient.

When, however, the distortion to the beam is not much greater than the fluctuation in the light source, the more detailed measurement provided by the reference spectrometer of this alternative embodiment is preferred.

Another alternative embodiment uses of a single fiber bundle instead of a bifurcated assembly with a beam splitter to separate reflected light from the illuminating light.

Best Mode

A Xenon flash lamp (such as Hamamatsu model number L4633) and a power supply with trigger socket (such as Hamamatsu model number C4479) are preferably used for the flash lamp and power supply with trigger, respectively. The sensor is preferably a short distance diffuse reflex sensor (such as Sunx model number CX-24).

It is preferred the spectrometer and the reference spectrometer be monolithic miniature-spectrometers (such as Zeiss model number MMS1).

The reference channel preferably comprises a photodiode such as that supplied by Hamamatsu. The synchronizer and bus interface and the reference synchronizer and bus interface can be implemented with the device supplied by TEC5.

The first and second data files can be implemented using any suitable storage medium for use in a computer, such as a hard disk drive, RAM, or the like. As is well known to one skilled in the art, the first and second data files and the data processing and algorithm development block can be integral parts of the monitoring system, rather than being components of an external unit.

Various data processing and algorithm development blocks are described in the references disclosed in the background section above.

The optical fiber is preferably a dual-bifurcated, fused-silica fiber bundle. Light spliters are implemented by diverting necessary portions of the fiber bundle. The minimum fiber bundle diameter is preferably 3 mm. It is also preferred that fewer than 5% of the fibers are diverted to the reference channel or reference spectrometer. Additional fibers, preferable equal in number to the illumination portion of the beam, are added for the collection of the reflected beam.

While the discussion above focused on a monitoring channel in a belt, it should be readily apparent that the above-described monitoring system can also be used with a rotating platen having a monitoring channel. However, the function of the sensor is different in the linear belt system. That is, in each of the embodiments described above that use a linear polishing element, the sensor detects when the monitoring channel in the belt is aligned with the film thickness monitor. In the rotary platen systems, however, the sensor detects when a wafer is aligned with a single monitoring channel in a moving platen, not when the monitoring channel is aligned with the film thickness monitor.

Methods Employing Thickness Measurements

The above embodiments can be used in a method for determining the thickness of a substrate layer during the CMP process. First, a substrate carrier would hold a substrate against a linearly moving belt or a rotating platen, either having a monitoring channel (as described above) and being wetted with a polishing agent. When the monitoring channel in the belt or rotating platen aligns with the film thickness monitor, thickness of the layer of the substrate can be determined, as described above.

Information regarding thickness has several uses. For example, it is important to stop the CMP process upon the removal of the last unwanted layer. As a consequence, end point detection is necessary and highly desirable when the last layer has been removed. End point detection can be determined by the thickness of the substrate layer. With this information, the CMP process can automatically or manually end.

Specifically, when a monitoring channel in the CMP tool aligns with a film thickness monitor, an optical circuit is completed between the film thickness monitor and the substrate. This enables measurement of the surface state of the substrate. Each time a monitoring channel in the CMP tool is aligned with a film thickness monitor, a film thickness measurement is made, resulting in a sequence of film thickness measurements during the CMP process. Therefore, the film thickness monitors described above may be used to determine and indicate the end point and may be used to manually or automatically end the CMP process in the above-described embodiments.

Thickness information can also be used in a method for determining removal rate at any given circumference of a substrate while performing a chemical-mechanical polishing process. When a monitoring channel in the CMP tool aligns with a film thickness monitor, the film thickness monitor determines film thickness at any given circumference on the substrate as described above. The difference of two consecutive film thickness measurements made through the same monitoring channel in the CMP tool is the film removal rate per polishing element revolution. Therefore, for a known tool speed, removal rate of the substrate is determined as thickness per unit time.

This method can also be adapted to determine the removal rate variation and average removal rate across a substrate surface. This is achieved in a similar manner to that described above, but with the use of multiple monitoring channels in CMP tool. In this case, each monitoring channel results in a film thickness measurement at a predefined circumference of the wafer substrate. Therefore, with every polishing element revolution, multiple film thickness measurements are made across the substrate surface. As described above, each of the measurements is converted into a removal rate. The average and variation of the removal rate across the substrate surface is thus computed. For example, the standard deviation of the measurements is indicative of the removal rate variation across the substrate surface.

Additionally, information regarding thickness can be used to adjust processing parameters of the CMP device. Removing uniformity can change during polishing of a substrate as a result of changes in belt (or moving platen) and substrate carrier conditions. With the film thickness monitors described above, the thickness of a substrate layer can be used to determine whether, for example, the center of the substrate is being polished at the same rate as the edge of the substrate. With this information, the polishing tool parameters can be modified, either manually or automatically, to compensate for the detected non-uniformity.

More specifically, the polishing process is first characterized in order to determine the effects of polish parameters such as polish pressure, belt or platen speed, carrier speed, polishing agent flow, etc. on responses such as substrate removal rate, uniformity, etc. A suitable model may be generated using software such as RS/1 available from BBN Software. During the polishing process, removal rate and removal rate variation across the substrate (uniformity) are determined as described above. This information would then be used in conjunction with the model developed to adjust the polish parameters (such as, but not limited to, down force, tool speed, and carrier speed) in order to optimize the removal rate and/or uniformity. This optimization may happen either in real time or in a delayed manner.

It is important to note that while "substrate" has been used as a working example for the above-described embodiments, any polished object can be used.

It is intended that the foregoing detailed description be understood as an illustration of selected forms that the invention can take and not as a definition of the invention. It is only the following claims, including all equivalents, which are intended to define the scope of this invention.

What is claimed is:

1. In a chemical mechanical polishing device of the type comprising: a polishing element, means for moving the polishing element along a polishing path, and a substrate carrier positioned adjacent the polishing element to press a substrate against the polishing element during a polishing operation; the improvement comprising:
    said polishing element having at least one opening formed therein, said opening positioned to move into intermittent alignment with the substrate during the polishing operation;
    said polishing element further comprising a monitoring window secured to the polishing element to close the opening and to create a monitoring channel in the polishing element; and
    said device further comprising a film thickness monitor, said film thickness monitor comprising a multi-wavelength spectrometer responsive to at least two wavelengths of optical radiation reflected from the substrate through the monitoring channel during the polishing operation to provide an indication of thickness of a film carried by the substrate.

2. The invention of claim 1, wherein the substrate carrier moves along a closed path.

3. The invention of claim 1 or 2, wherein the film thickness monitor comprises a light source operative to illuminate the substrate via the monitoring channel with at least two wavelengths of optical radiation during the polishing operation.

4. The invention of claim 1 or 2, wherein the film thickness monitor comprises a light source and is operative to generate at least two wavelengths of optical radiation between about 300 nm and 1,000 nm.

5. The invention of claim 1 wherein the moving means comprises a plurality of rollers operative to drive the polishing element in a linear path past the substrate.

6. The invention of claim 5, wherein the film thickness monitor further comprises a sensor for detecting when the monitoring window in the polishing element is in alignment with the film thickness monitor.

7. The invention of claim 1, wherein the moving means comprises a platen rotating about an axis that passes through its center operative to drive the polishing element in a curved path past the substrate.

8. The invention of claim 1, wherein the moving means comprises a platen rotating about an axis that does not pass through its center operative to drive the polishing element in a curved path past the substrate.

9. The invention of claim 1, wherein the moving means comprises a platen moving along a closed path operative to drive the polishing element in a curved path past the substrate.

10. The invention of claim 1, wherein the film thickness monitor comprises:
    (a) a light source;
    (b) a light sensitive detector for monitoring an intensity from the light source;
    (c) a spectrometer that dispenses light into multiple wavelengths that are detected by multiple detectors; and
    (d) a data processing element for processing signals from the spectrometer and estimating a thickness of a film on a substrate.

11. The invention of claim 10, wherein the light source is a flash lamp emitting optical radiation synchronous with a moving substrate.

12. The invention of claim 10, wherein the light source is a substantially continuously operating light source and wherein the invention further comprises a shutter operating synchronously with a moving substrate in order to output light when the substrate is positioned over the light source.

13. The invention of claim 10, wherein the light sensitive detector is a spectrometer.

14. A method for determining thickness of a layer on a substrate during chemical-mechanical polishing, the method comprising the steps of:
    (a) performing chemical-mechanical polishing on a substrate
    (b) illuminating the substrate with at least two wavelengths of optical radiation during step (a);
    (c) using a multi-wavelength spectrometer to receive said at least two wavelengths of optical radiation after being reflected from the substrate; and
    (d) determining the thickness of a film carried by the substrate from said at least two wavelengths of optical radiation received in step (c).

15. A method for determining an end point of a chemical-mechanical polishing process, the method comprising the steps of:
    (a) illuminating a substrate with at least two wavelengths of optical radiation during chemical-mechanical polishing of the substrate;
    (b) using a multi-wavelength spectrometer to receive said at least two wavelengths of optical radiation after being reflected from the substrate;

(c) determining a thickness of a film carried by the substrate from said at least two wavelengths of optical radiation received in step (b); and (d) indicating that end point has been reached in response to the film thickness determined in step (c) reaching a predefined thickness.

16. The invention of claim 15 further comprising the step of terminating the chemical-mechanical polishing process when the film thickness reaches a predefined thickness.

17. A method for determining removal rate per polishing element revolution at any given circumference of a substrate while performing a chemical-mechanical polishing process, the method comprising the steps of:

(a) measuring a first film thickness of a substrate during a chemical-mechanical polishing process when a monitoring channel in a polishing element aligns with a film thickness monitor comprising a spectrometer; and then (b) measuring a second film thickness of a substrate during a chemical-mechanical polishing process when the monitoring channel in a polishing element realigns with the film thickness monitor comprising a spectrometer; and then (c) calculating a difference between the second film thickness and the first film thickness.

18. A method for determining average removal rate per polishing element revolution across a substrate surface while performing a chemical-mechanical polishing process, the method comprising the steps of:

(a) measuring a first film thickness of a substrate during a chemical-mechanical polishing process when a first monitoring channel in a polishing element aligns with a first film thickness monitor comprising a spectrometer; and then (b) measuring a second film thickness of a substrate during a chemical-mechanical polishing process when the first monitoring channel in a polishing element realigns with the first film thickness monitor comprising a spectrometer; and then (c) measuring a third film thickness of a substrate during a chemical-mechanical polishing process when a second monitoring channel in a polishing element aligns with a second film thickness monitor comprising a spectrometer; and then (d) measuring a fourth film thickness of a substrate during a chemical-mechanical polishing process when the second monitoring channel in a polishing element realigns with the second film thickness monitor comprising a spectrometer; and then (e) calculating a difference between the second film thickness of step (b) and the first film thickness of step (a); and (f) calculating a difference between the fourth film thickness of step (d) and the third film thickness of step (c); and then (g) calculating an average of the differences of steps (e) and (f).

19. A method for determining removal rate variation per polishing element revolution across a substrate surface while performing a chemical-mechanical polishing process, the method comprising the steps of:

(a) measuring a first film thickness of a substrate during a chemical-mechanical polishing process when a first monitoring channel in a polishing element aligns with a first film thickness monitor comprising a spectrometer; and then (b) measuring a second film thickness of a substrate during a chemical-mechanical polishing process when the first monitoring channel in a polishing element realigns with the first film thickness monitor comprising a spectrometer; and then (c) measuring a third film thickness of a substrate during a chemical-mechanical polishing process when a second monitoring channel in a polishing element aligns with a second film thickness monitor comprising a spectrometer; and then (d) measuring a fourth film thickness of a substrate during a chemical-mechanical polishing process when the second monitoring channel in a polishing element realigns with the second film thickness monitor comprising a spectrometer; and then (e) calculating a difference between the second film thickness of step (b) and the first film thickness of step (a); and (f) calculating a difference between the fourth film thickness of step (d) and the third film thickness of step (c); and then (g) calculating a variation of the differences of steps (e) and (f).

20. A method of optimizing a chemical-mechanical polishing process comprising the steps of:

(a) illuminating a substrate with at least two wavelengths of optical radiation;

(b) using a multi-wavelength spectrometer to receive said at least two wavelengths of optical radiation after being reflected from the substrate, (c) determining a removal rate of a film carried by the substrate from said at least two wavelengths of optical radiation received in step (b); and then (d) adjusting polishing process parameters to optimize the removal rate.

21. The invention of claim 20 further comprising the steps of:

(e) determining removal rate variation; and then (f) adjusting polishing process parameters to optimize uniformity.

* * * * *